United States Patent [19]
Leung et al.

[11] Patent Number: 6,075,720
[45] Date of Patent: Jun. 13, 2000

[54] MEMORY CELL FOR DRAM EMBEDDED IN LOGIC

[76] Inventors: Wingyu Leung, 10450 Orange Ave., Cupertino, Calif. 95014; Fu-Chieh Hsu, 21775 Congress Hall La., Saratoga, Calif. 95070

[21] Appl. No.: 09/134,488

[22] Filed: Aug. 14, 1998

[51] Int. Cl.$^7$ .................................................. G11C 11/24
[52] U.S. Cl. ...................................... 365/149; 365/189.09
[58] Field of Search .............................. 365/149, 189.09, 365/226, 230.06; 257/296, 313

[56] References Cited

U.S. PATENT DOCUMENTS

| | | | |
|---|---|---|---|
| 5,198,995 | 3/1993 | Dennard et al. | 365/149 |
| 5,394,365 | 2/1995 | Tsukikawa | 365/189.09 |
| 5,694,355 | 12/1997 | Skjaveland et al. | 365/149 |

*Primary Examiner*—David Nelms
*Assistant Examiner*—David Lam
*Attorney, Agent, or Firm*—The Law Offices of Bever & Hoffman, LLP

[57] ABSTRACT

A structure which stores charge useful in a DRAM provides small cell size and eliminates subthreshold leakage current of the access transistor in the cell. Hence this is highly suitable for use for instance in ASICs (applications specific integrated circuits) which are fabricated using "logic" circuit fabrication techniques which normally do not accommodate DRAM cells. The DRAM charge storage structure includes a p-channel access transistor and an n-doped well in a p-doped substrate, a p-channel charge storage capacitor with its source/drain directly connected to the source region of the access field effect transistor, a source of a voltage to the gate of the storage capacitor, and a voltage source connected to the wordline and thereby to the gate terminal of the access transistor which switches between two voltage levels.

24 Claims, 5 Drawing Sheets

MEMORY CELL FOR DRAM EMBEDDED IN LOGIC

FIELD OF THE INVENTION

This invention relates to a charge storage structure for a dynamic random access memory (DRAM) and an associated wordline driver circuit which are particularly suitable for use in combination with logic circuitry, e.g. in an ASIC.

BACKGROUND

With reference to FIGS. 1A and 1B showing respectively a schematic diagram and chip cross section view, a standard DRAM utilizes a charge storage cell for storing a data bit and having a cell access FET (field effect transistor) 1 which has its gate terminal connected to a wordline 3 and its drain terminal connected to a bit line 4. (The actual DRAM chip of course, includes a plurality of such cells arranged in a row/column array.) Capacitor 2 is connected between the source terminal of FET 1 and a voltage source Vbb. In standard DRAM fabrication processes, special processing steps are used to optimize and minimize the capacitor size and the cell size. Such techniques include using higher-capacitance dielectric for the capacitor, special implants to create an FET with higher threshold voltage ($V_T$), stacked capacitor structure, trench capacitor structure, and combinations of these techniques. However, in standard ASIC (application specific integrated circuit) fabrication processes, no such special processing steps are readily available and the capacitor must be implemented using a standard FET structure. An ASIC process is typically used for logic as compared to memory, and so the standard ASIC FETs are logic-type transistors with relatively low threshold voltage ($V_T$). In addition, the DRAM cells preferably are placed inside an isolated well to minimize noise disturbances from logic circuit switching and soft error rate due to alpha particle induced carrier generation. No such wells are available using standard ASIC fabrication processes for either the n-channel FET or the p-channel FET of the logic circuit.

In FIGS. 1A, 1B the wordline 3 switches between voltages Vdd and Vbb. However, in a chip fabricated using an ASIC process, the threshold voltage (Vt) for access FET 1 is often not high enough to completely eliminate subthreshold leakage current in the access FET 1 even with the use of voltage Vpp (which is higher than Vdd to introduce backgate effect to increase the Vt level as well as to increase the field threshold voltage associated with field oxide isolation) to bias the n-well.

Other structures shown in FIG. 1B are conventionally the p-doped substrate 8, n-doped well 10, a p doped region 12 which is a drain/source region of FET 1, the upper terminal of capacitor 2 which is "gate" metallization 13, field oxide region 14, n-well contact 16, and field oxide region 18.

Another known implementation, see U.S. Pat. No. 5,600, 598 "Memory cell and wordline driver for embedded DRAM in ASIC process" K. Skjaveland and P. Gillingham shown in present FIGS. 2A and 2B, connects the source region 12 of the access FET 1 to the "gate" terminal 13 of the storage capacitor 2 to reduce junction leakage. This patent asserts that negative Vbb D.C. bias is not possible in an ASIC process and a p-channel dynamic wordline driver circuit must be used to generate voltage Vbb in the wordline driver. This configuration also eliminates the need to generate a constant Vbb voltage to bias the gate of the storage capacitor, and the wordline boosted voltage (Vbb) is dynamically generated in the wordline driver circuit.

However, this configuration undesirably requires much bigger cell size due to the need to form an interconnection 25 as depicted between the source terminal 12 of the access FET 1 and the gate terminal 13 of the storage capacitor 2.

Structures in FIG. 2B similar to those in FIG. 2A thus have similar reference numbers although they are arranged slightly differently. FIG. 2B additionally shows a second p region 20 to which voltage Vpp is connected and an additional field oxide region 24 separating contact regions 16 and 20. In addition, the wordline 3 still switches between voltages Vdd and Vbb, making it difficult to eliminate subthreshold leakage current in the access FET 1.

SUMMARY

The present invention is directed to a DRAM cell structure for storage of charge which provides small cell size, eliminates subthreshold leakage current of the access FET, and is highly suitable for use in ASICs. In accordance with one embodiment of the invention, a DRAM charge storage structure includes a p-channel access FET in an n-doped well of a p-doped substrate, a p-channel charge storage capacitor with a source/drain region directly connected to the source region of the access FET, a source for supplying a voltage Vbb1 to the gate terminal of the storage capacitor, and a connection to the wordline to the gate of the access FET for switching between voltage levels Vbb2 and Vpp2. Thus in this embodiment a DRAM charge storage structure includes a p-channel access FET in an n-doped well of a p-doped substrate, a p-channel charge storage capacitor, the charge capacitor having p doped source/drain region diffused into the n-well which is directly connected to the source region of the access FET, a connection between the gate terminal of the storage capacitor and a voltage source Vbb1 which is below the voltage levels of both 0 and 1 logic levels for the stored charges, an n doped region diffused into the n-well, a connection of the n doped region to a voltage source Vpp1 which is above the voltage levels of both 0 and 1 logic levels, and sources of the voltages Vbb1 and Vpp1.

In another embodiment a DRAM charge storage structure includes a p-channel access FET in an n-doped well of a p-doped substrate, a p-channel charge storage capacitor, the charge capacitor having a p doped source/drain region diffused into the n-well which is directly connected to the source region of the access FET, a connection between the gate terminal of the access FET and a wordline driving circuit which includes an inverter switching between a voltage source Vpp2 which is above the voltage levels of both 0 and 1 logic levels for the stored charges and a voltage source Vbb2 which is below the voltage levels of both 0 and 1 logic levels, and sources of the Vbb2 and Vpp2 voltages.

Of course, the n and p doping types are reversed in other embodiments.

BRIEF DESCRIPTION OF THE DRAWINGS

A better understanding of the invention will be obtained by reading the description below, with reference to the following drawings, in which.

DETAILED DESCRIPTION

Figure 1A:
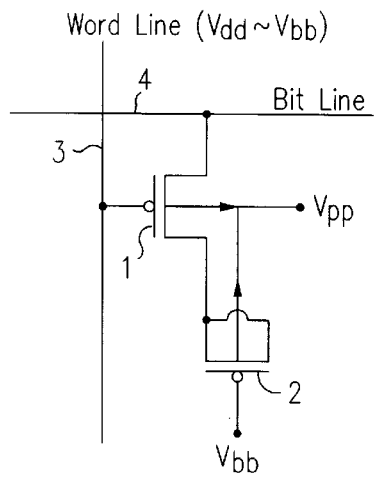
FIG. 1A is a schematic diagram of a prior art p-channel DRAM storage cell.
Figure 1B:
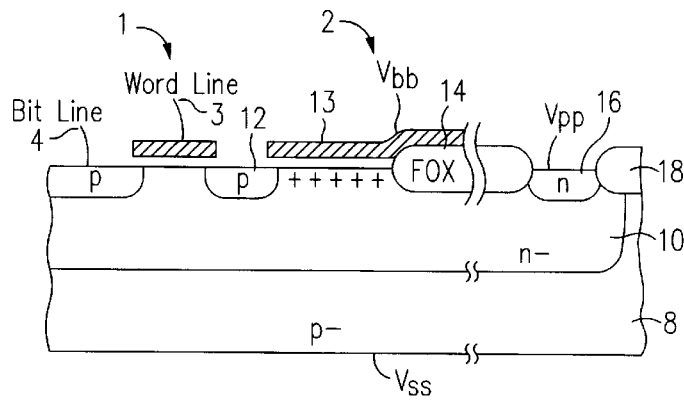
FIG. 1B is a chip cross section of the cell of FIG. 1A.
Figure 2A:
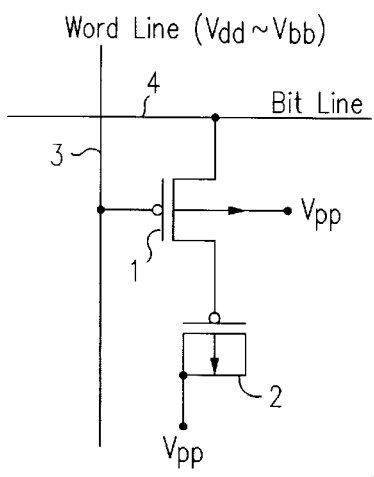
FIG. 2A is a schematic diagram of another prior art p-channel DRAM storage cell.
Figure 2B:
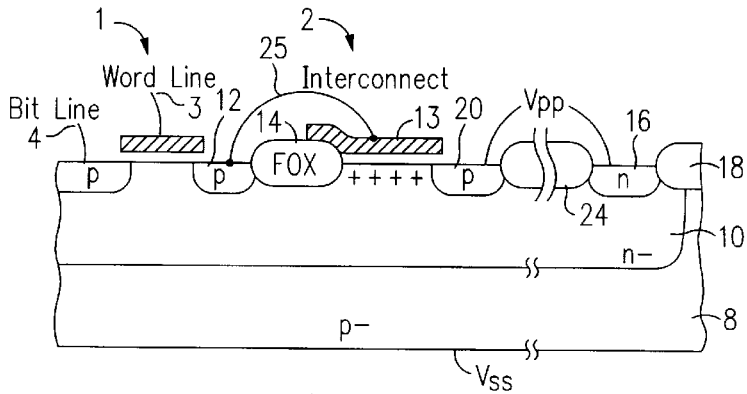
FIG. 2B is a chip cross section of the cell of FIG. 2A.
Figure 3A:
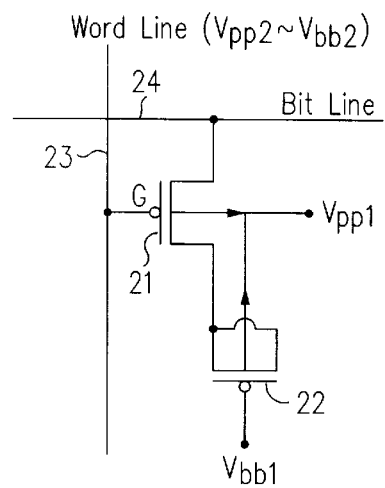
FIG. 3A is a schematic diagram of a p-channel DRAM storage cell in accordance with the present invention.
Figure 3B:
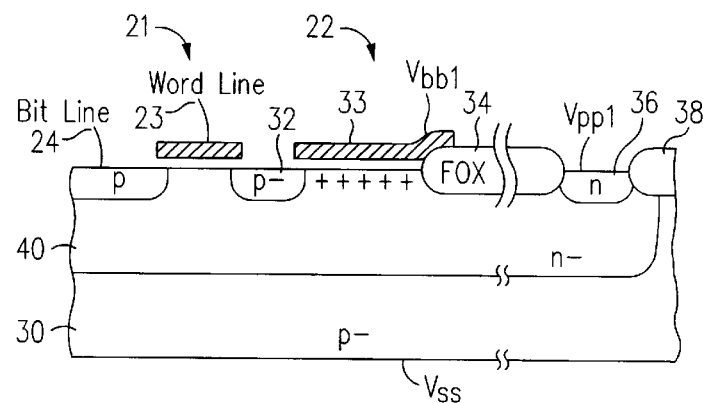
FIG. 3B is a chip cross section of the cell of FIG. 3A.
Figure 3C:
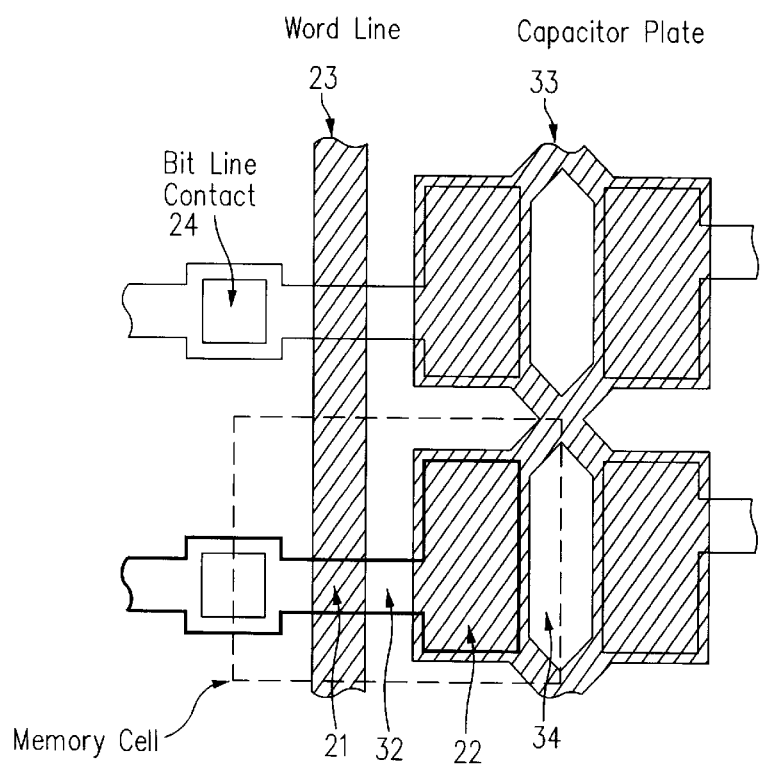
FIG. 3C shows a memory cell layout in accordance with the present invention.

In FIGS. 3A and 3B, a p-channel access FET 21 and p-channel capacitor 22 are located inside an n-doped well 40 of a p-doped substrate 30 (as in the embodiment of FIGS. 1A and 1B.) In this case, however, the source/drain region connecting the access FET 21 and the capacitor 22 includes a p-lightly doped drain (LDD) region instead of the more heavily doped p region as in the prior art. FIG. 3C shows in a plan view the memory cell layout in accordance with the present invention; the bitline connection 24 is shared between two neighboring cells and the capacitor plate 33 connects two rows of adjacent cells parallel to the wordline. The capacitors of adjacent cells are electrically isolated through field oxide (FOX) region 34, e.g. at the minimum spacing allowed by the design rules. Because the capacitor plate 33 of the present invention is biased at the Vbb1 level to allow the maximum turn-on of the p-channel capacitor, this also represents a worse case biasing over the field oxide (FOX) with maximum leakage current that can flow between neighboring cell storage nodes. To minimize such field leakage current, the capacitor plate 33 layout of the present invention is allowed to cross-over field oxide only along diagonal corners of adjacent storage nodes. This forces the possible leakage path between adjacent cells to be 1.414 times the minimum FOX isolation spacing, and at the same time reduces the portion of the storage node perimeter (at minimum spacing) that is adversely gated by the capacitor plate to be less than 25% of the total storage node perimeter (which is the channel region of the capacitor FET) and thereby minimizes possible leakage current.

Figure 3D:
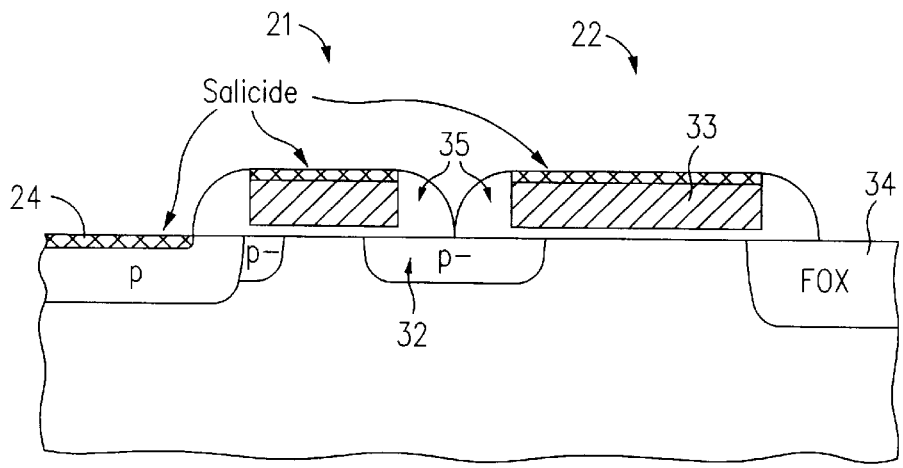
FIG. 3D shows the enlarged cross-section of the P-connection between the access FET and the capacitor.

FIG. 3D shows an enlarged cross-section view of the structure between access FET 21 and p-channel capacitor 22 in accordance with the present invention. Normal p-type heavy source/drain implant and source/drain salicidation are excluded from this connecting region 32. This arrangement is important in reducing the junction leakage current as well as gate-induced drain leakage (GIDL) that can degrade the charge retention time of the storage node. In a typical ASIC process, the formation of the p-channel FET usually follows the sequence of (i) patterning and etching the polysilicon gate, (ii) use ion implantation to lightly dope the source/drain (LDD) region right at the gate edge, (iii) forming insulating sidewall spacer, (iv) forming salicide (self-aligned silicide) on the exposed silicon surface, and (v) use ion implantation to heavily dope the source/drain region in exposed silicon surface. The two-step source/drain formation of p-LDD and p-S/D regions are for the proper transistor design to have high conduction current and good leakage current control at the same time. The p-S/D region is usually much more heavily doped to have low resistivity than the p-LDD region. As a result, the junction breakdown voltage is lower and leakage current of the p-S/D is much higher than that of the p-LDD region. The source/drain salicide reduces the source/drain resistivity further but also degrades the junction leakage further. Therefore, it is important to exclude as much heavy p doping and salicide formation in the storage node as possible.

In the present invention, region 32 is laid out with minimum polysilicon gate spacing which is comparable to twice the size of the insulating sidewall spacer 35. With this layout arrangement, the p-S/D doping and the salicide are effectively excluded from the storage node without need for additional processing steps. Except for the small connecting region 32, the rest of the storage node will receive neither p-S/1) nor salicide for lowest junction leakage and GIDL.

Figure 4:
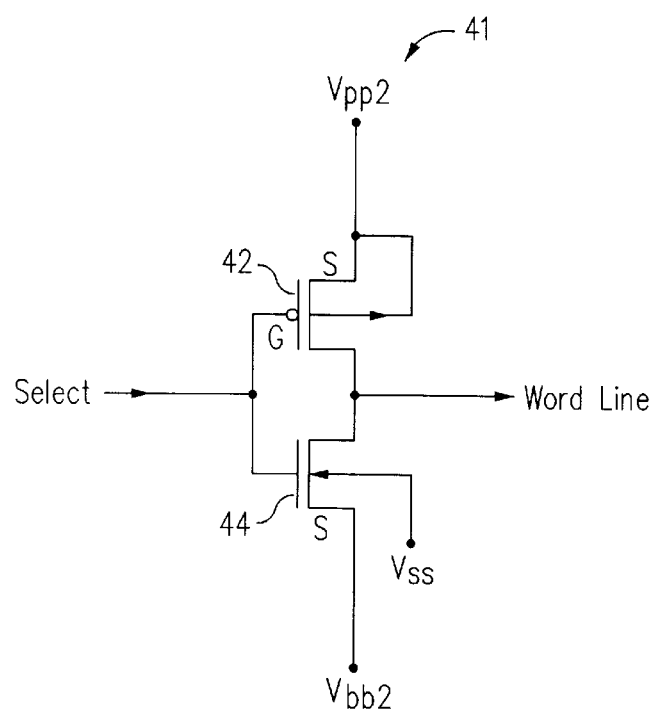
FIG. 4 is a wordline driving circuit in accordance with the present invention.

Another difference between the present invention and the prior art is that the gate terminal of the access FET 21 is switched between voltage levels Vpp2 and Vbb2 using a word line driving circuit 41 of the type for instance shown in FIG. 4. The structures shown in FIG. 3B are essentially identical to those shown in corresponding FIG. 1B although they carry different reference numbers. Their fabrication is essentially identical to those in FIG. 1B. Similarly FIG. 3A schematically is identical to FIG. 1A.

The word line driving circuit 41 of FIG. 4 which is coupled to word line 23 of FIG. 3A is a standard CMOS inverter having transistors 42, 44 with the p-channel transistor 42 source terminal S and its associated n-doped well (not shown) connecting to the Vpp2 voltage source which is at a voltage higher than the Vdd voltage level. This is important because when the gate terminal G of the access FET 21 in FIG. 3A is biased at the Vpp2 level (i.e., when the access FET 21 is turned off), the gate G is now reverse biased an amount equal to Vpp2−Vdd which works to eliminate the subthreshold leakage current for the access FET 21.

The access FET 21 may have relatively low Vt magnitude level such as −0.4V to −0.7V when fabricated using an ASIC process, even with backgate bias effect from the Vpp voltage. In accordance with the present invention, the voltage differential Vpp2−Vdd is usually chosen between 0.2V to 0.6V (less than one diode drop of 0.7V). As a result, the gate to source turn-off voltage can be the equivalent of an extra −0.2V to −0.6V added to the Vt effectively, and is therefore more effective in turning off the access FET 21 completely. The source terminal S of the n-channel transistor 44 of FIG. 4 of the inverter is connected to the Vbb2 voltage source which is at a voltage lower than the Vss voltage level (e.g. ground). This is also important because this provides a "boosted" voltage level below voltage Vss when the gate of the access FET 21 is turned on. This boost allows the low voltage state (Vss level) on the bit line 24 of FIG. 3A to pass into the storage capacitor 22 more effectively. (Note that for a standard nominally "2.5 volt" circuit, Vpp1 is e.g. 2.9V, Vdd is 2.5V, Vss is 0V, and Vbb1 is −0.4V.)

With an inverter type circuit 41 as in FIG. 4, the wordline driver circuit can switch much faster than a dynamically boosted wordline driver such as described in U.S. Pat. No. 5,600,598, therefore providing higher speed access to the memory array.

In accordance with the present invention, the Vbb2 voltage level is usually chosen to be −0.2V to −0.6V, as compared to −1.0V or more negative in a traditional DRAM implementation. This desirably reduces the maximum voltage difference across the gate oxide, giving better reliability. It also allows the fabrication of the Vbb2 voltage source in an ASIC fabrication process without requiring the n-channel transistor 44 to be located inside an isolated p-well (which is a structure normally not available in ASIC processes). Similarly, the Vbb1 voltage for the gate terminal G of the access FET 22 can be chosen to be the same or similar to the Vbb2 voltage.

Figure 5:
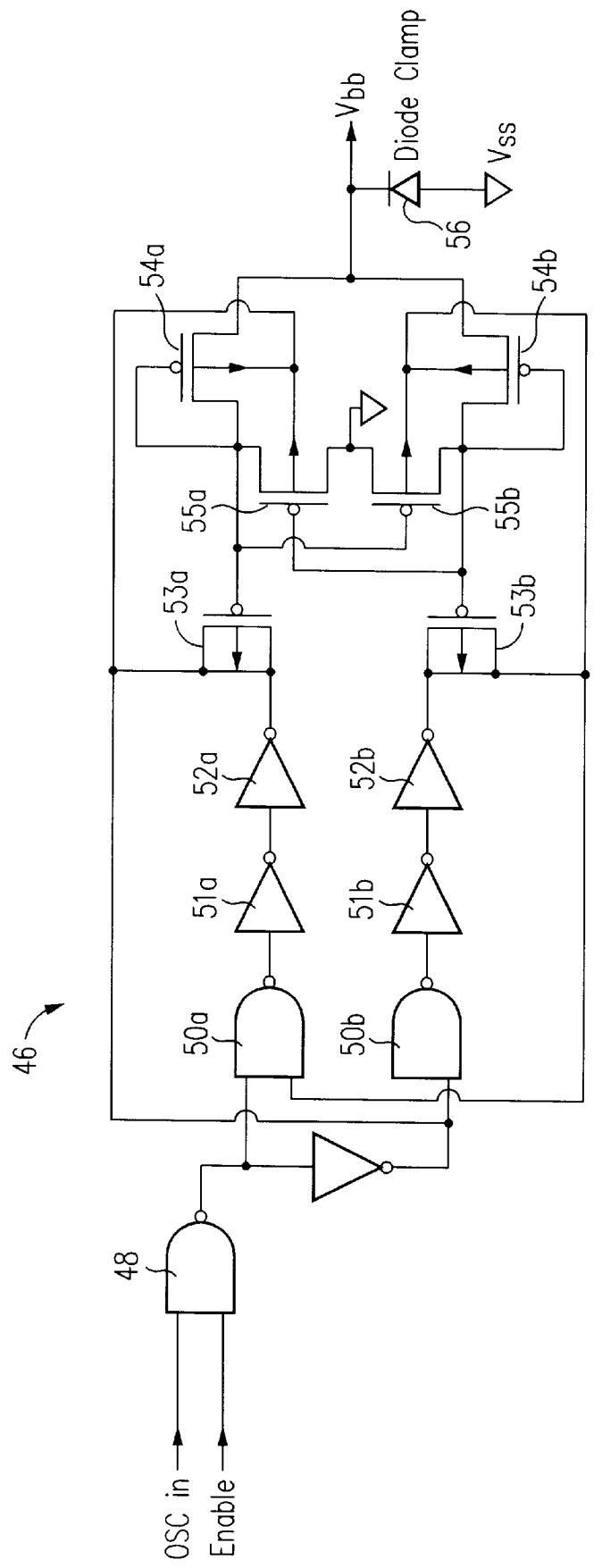
FIG. 5 is a Vbb voltage generator in accordance with the present invention.

A typical Vbb generator circuit 46 (voltage source) used with this invention is shown in FIG. 5. This circuit provides voltages Vbb1, Vbb2 which may be at the same or different voltages. An oscillator or clock input (signal OSC IN) gated by NAND gate 48 by an ENABLE signal (for power-down purpose, for example) drives a charge pump (such as described in U.S. Pat. No. 5,703,827 "Method and structure for generating a boosted wordline voltage and back bias voltage for a memory array" Wingyu Leung and J. J. Lin) with the output voltage Vbb set by a diode clamp 56.

Other elements shown in FIG. 5 in the charge pump include the upper set of gates and transistors respectively NAND gate 50*a*, inverter 51*a*, inverter 52*a*, p-channel transistor 53*a*, p-channel transistor 54*a* and p-channel transistor 55*a*. A similar chain of elements is shown along the bottom portion of FIG. 5. The clock signal received by charge pump circuit 46 is applied to the circuit formed by inverters 51*a*, 51*b*, 52*a* and 52*b* and cross-coupled NAND gates 50*a* and 50*b*, thereby alternately charging the capacitors formed by p-channel transistors 53*a* and 53*b*. P-channel transistors 54*a*, 54*b*, 55*a* and 55*b* alternately switch the charge stored in capacitors 53*a* and 53*b* to the Vbb supply line to generate the Vbb voltage. Because switching transistors 55*a* and 55*b* are connected to the ground voltage supply, negative charge is pumped from capacitors 53*a* and 53*b* to the Vbb supply line. Consequently, the Vbb bias voltage built up on the Vbb supply line is a negative voltage. The diode clamp 56 includes all the partially forward-biased source-to-substrate diodes of the word line driving circuit 41. Multiple charge pumps as well as gating control of the voltage Vbb to the source terminal of the n-channel transistor 44 of the wordline driving circuit 41 may be implemented to control the Vbb1, Vbb2 voltage levels and power dissipation of the Vbb sources 46. Because the n-channel transistor source-substrate is forward biased in the Vbb generator circuit 46 and the wordline driving circuit 41, special layout precaution should be taken to provide adequate guard-rings in those circuits to prevent latch-up from occurring.

Figure 6A:
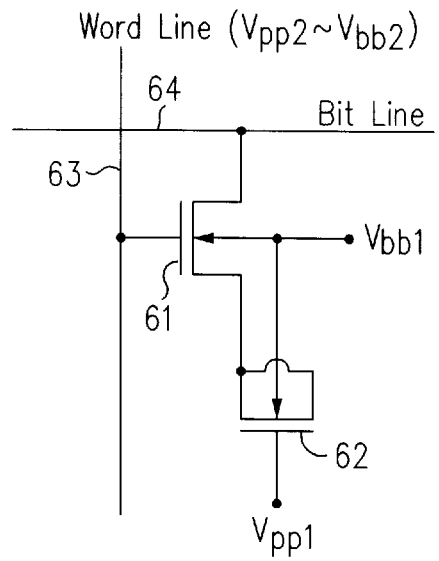
FIG. 6A is a schematic diagram of a n-channel DRAM storage cell in accordance with the present invention.
Figure 6B:
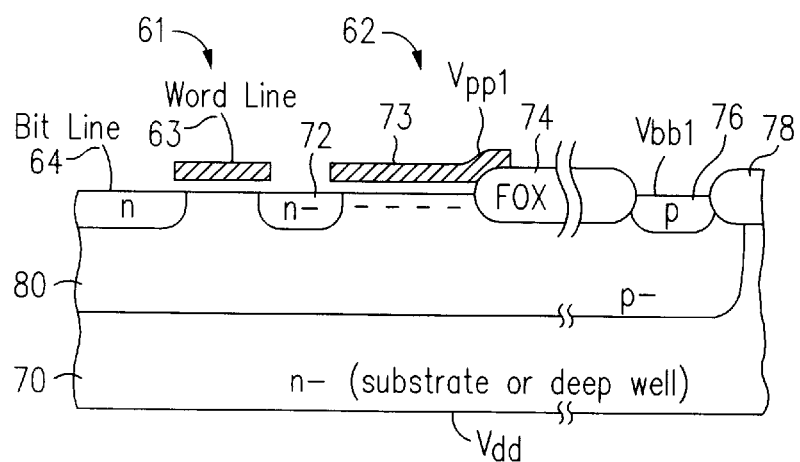
FIG. 6B is a chip cross section of the cell of FIG. 6A.

The DRAM cell of FIGS. 3A, 3B may similarly be implemented using an n-channel access FET and capacitor as shown in FIGS. 6A and 6B, provided that the p-doped well 80 for the n-channel FET 61 is in an n-doped substrate 70 or in a deep n-doped well of a p-doped substrate (not shown).

Except for the reversal of the doping types, the structure of FIG. 6B is the same as that of FIG. 3B including in addition to n-doped substrate 70, the p-doped well 80, the n-doped region 72 which is a source/drain of the access transistor 61, the capacitor electrode 73, the field oxide 74, the p doped contact region 76 and a second field oxide region 78. Note that region 70 may be, as in FIG. 3B, a deep well instead of a substrate. The same inverter-type wordline driving circuitry as in FIG. 4 can be used, with appropriate substitutions between p-channel and n-channel FETs.

This disclosure is illustrative and not limiting; further modifications will be apparent to one skilled in the art and are intended to fall within the scope of the appended claims.

We claim:

1. A dynamic random access memory (DRAM) circuit for storing a bit indicated by a 0 or 1 logic level signal, comprising:

an n-type semiconductor region;

a p-well located in the n-type semiconductor region;

an n-channel access transistor having a first n-type source/drain region and a second n-type source/drain region located in the p-well;

a capacitor coupled to the second n-type source/drain region of the access transistor, the capacitor including a conductor overlying a portion of the p-well; and a wordline driver connected to a gate terminal of the access transistor, the wordline driver being configured to apply a first voltage to the gate terminal of the access transistor when the DRAM circuit is not being accessed, the first voltage being less than the voltages determining both the 0 and 1 logic levels.

2. The DRAM circuit of claim 1, wherein the first voltage is in the range of −0.2 Volts to −0.6 Volts.

3. The DRAM circuit of claim 1, wherein the wordline driver is further configured to apply a second voltage to the gate terminal of the access transistor when the DRAM circuit is being accessed, the second voltage being greater than the voltages determining both the 0 and 1 logic levels.

4. The DRAM circuit of claim 3, wherein the second voltage is in the range of 0.2 to 0.6 Volts greater than a positive supply voltage of the DRAM circuit.

5. The DRAM circuit of claim 1, further comprising:

a p-type contact region located in the p-well and spaced apart from the capacitor; and a negative voltage source connected to the contact region, the negative voltage source supplying a voltage less than voltages determining both the 0 and 1 logic levels.

6. The DRAM circuit of claim 5, further comprising a positive voltage source coupled to the conductor of the capacitor, the positive voltage source supplying a voltage greater than voltages determining both the 0 and 1 logic levels.

7. The DRAM circuit of claim 1, wherein the wordline driver comprises:

a first voltage source for providing the first voltage; and a pull-down transistor coupled between the first voltage source and the gate terminal of the access transistor.

8. The DRAM circuit of claim 7, wherein the word line driver further comprises;

a second voltage source for providing a second voltage greater than voltages determining both the 0 and 1 logic levels; and a pull-up transistor coupled between the second voltage source and the gate terminal of the access transistor.

9. The DRAM circuit of claim 1, wherein the first source/drain region is more heavily doped than the second source/drain region.

10. A dynamic random access memory (DRAM) circuit for storing a bit indicated by a 0 or 1 logic level signal, comprising:

a p-type semiconductor region;

an n-well located in the p-type semiconductor region;

a p-channel access transistor having a first p-type source/drain region and a second p-type source/drain region located in the n-well;

a capacitor coupled to the second source/drain region of the access transistor, the capacitor including a conductor overlying a portion of the n-well; and a wordline driver connected to a gate terminal of the access transistor, the wordline driver being configured to apply a first voltage to the gate terminal of the access transistor when the DRAM circuit is not being accessed, the first voltage being greater than the voltage determining both the 0 and 1 logic levels.

11. The DRAM circuit of claim 10, wherein the first voltage is in the range of 0.2 to 0.6 Volts greater than a positive supply voltage of the DRAM circuit.

12. The DRAM circuit of claim 10, wherein the wordline driver is further configured to apply a second voltage to the gate terminal of the access transistor when the DRAM circuit is being accessed, the second voltage being less than the voltages determining both the 0 and 1 logic levels.

13. The DRAM circuit of claim 12, wherein the second voltage is in the range of −0.2 Volts to −0.6 Volts.

14. The DRAM circuit of claim 10, further comprising:
   an n-type contact region located in the n-well and spaced apart from the capacitor; and
   a positive voltage source connected to the contact region, the positive voltage source supplying a voltage greater than voltages determining both the 0 and 1 logic levels.

15. The DRAM circuit of claim 14, further comprising a negative voltage source-coupled to the conductor of the capacitor, the negative voltage source supplying a voltage less than voltages determining both the 0 and 1 logic levels.

16. The DRAM circuit of claim 10, wherein the wordline driver comprises:
   a first voltage source for providing the first voltage; and
   a pull-up transistor coupled between the first voltage source and the gate terminal of the access transistor.

17. The DRAM circuit of claim 16, wherein the word line driver further comprises;
   a second voltage source for providing a second voltage less than voltages determining both the 0 and 1 logic levels; and
   a pull-down transistor coupled between the second voltage source and the gate terminal of the access transistor.

18. The DRAM circuit of claim 10, wherein the first source/drain region is more heavily doped than the second source/drain region.

19. The DRAM circuit of claim 10, wherein the first source/drain region includes silicidation and the second source/drain region is substantially free of silicidation.

20. The DRAM circuit of claim 10, further comprising:
   a first column of capacitors, wherein the capacitor is located in the first column of capacitors;
   a second column of capacitors located adjacent to the first column of capacitors, wherein the first column of capacitors and the second column of capacitors share the conductor; and
   a field isolation region separating the capacitors in the first column of capacitors and the second column of capacitors, the field isolation region defining a minimum field isolation spacing between adjacent capacitors, wherein the conductor extends over the field isolation region between adjacent capacitors along paths that are substantially longer than the minimum field isolation spacing.

21. A dynamic random access memory (DRAM) circuit for storing a bit indicated by a 0 or 1 logic level signal, comprising:
   an n-type semiconductor region;
   a p-well located in the n-type semiconductor region;
   an n-channel access transistor having a first n-type source/drain region and a second n-type source/drain region located in the p-well;
   a capacitor coupled to the second n-type source/drain region of the access transistor, the capacitor including a conductor overlying a portion of the p-well; and
   a wordline driver connected to a gate terminal of the access transistor, the wordline driver being configured to apply a first voltage to the gate terminal of the access transistor when the DRAM circuit is being accessed, the first voltage being greater than a positive supply voltage (Vdd) of the DRAM circuit by less than one diode drop.

22. The DRAM circuit of claim 21, wherein the first voltage is in the range of 0.2 to 0.6 Volts.

23. A dynamic random access memory (DRAM) circuit for storing a bit indicated by a 0 or 1 logic level signal, comprising:
   a p-type semiconductor region;
   an n-well located in the p-type semiconductor region;
   a p-channel access transistor having a first p-type source/drain region and a second p-type source/drain region located in the n-well;
   a capacitor coupled to the second source/drain region of the access transistor, the capacitor including a conductor overlying a portion of the n-well; and
   a wordline driver connected to a gate terminal of the access transistor, the wordline driver being configured to apply a first voltage to the gate terminal of the access transistor when the DRAM circuit is being accessed, the first voltage being less than a negative supply voltage (Vss) of the DRAM circuit by less than one diode drop.

24. The DRAM circuit of claim 23, wherein the first voltage is in the range of −0.2 to −0.6 Volts.

* * * * *

UNITED STATES PATENT AND TRADEMARK OFFICE
CERTIFICATE OF CORRECTION

PATENT NO : 6,075,720
DATED : June 13, 2000
INVENTOR(S) : Wingyu Leung and Fu-Chieh Hsu It is certified that error appears in the above-identified patent and that said Letters Patent is hereby corrected as shown below:

On the title page: Item [73] Assignee: insert
Assignee: Monolithic System Technology, Inc., Sunnyvale, CA Signed and Sealed this Thirteenth Day of March, 2001

Attest:

NICHOLAS P. GODICI

*Attesting Officer*  *Acting Director of the United States Patent and Trademark Office*